(12) United States Patent
DeSimone et al.

(10) Patent No.: US 10,769,850 B1
(45) Date of Patent: Sep. 8, 2020

(54) SYSTEMS AND METHODS FOR EFFICIENT UPDATING OF AN ANALYSIS MESH

(71) Applicant: Ansys, Inc., Canonsburg, PA (US)

(72) Inventors: Frank DeSimone, Berlin, MA (US); Vivek J. Joshi, McDonald, PA (US); Joseph Borella, Canonsburg, PA (US); John Svitek, Pittsburgh, PA (US); Mukesh Bauskar, Bethel Park, PA (US); James West, Jefferson Hills, PA (US); Jitendra Kulkarni, Acton, MA (US)

(73) Assignee: Ansys, Inc., Canonsburg, PA (US)

( * ) Notice: Subject to any disclaimer, the term of this patent is extended or adjusted under 35 U.S.C. 154(b) by 103 days.

(21) Appl. No.: 15/893,890

(22) Filed: Feb. 12, 2018

Related U.S. Application Data

(60) Provisional application No. 62/458,198, filed on Feb. 13, 2017.

(51) Int. Cl.
*G06T 17/20* (2006.01)
*G06F 30/23* (2020.01)

(52) U.S. Cl.
CPC ............ *G06T 17/205* (2013.01); *G06F 30/23* (2020.01); *G06T 2200/24* (2013.01)

(58) Field of Classification Search
CPC ............... G06T 17/205; G06T 2200/24; G06F 17/5018
See application file for complete search history.

(56) References Cited

U.S. PATENT DOCUMENTS

| | | | |
|---|---|---|---|
| 9,323,869 B1* | 4/2016 | Kanthasamy | G06F 17/5018 |
| 2003/0149500 A1* | 8/2003 | Faruque | G06F 17/5018 700/97 |
| 2017/0193695 A1* | 7/2017 | Lama | G06T 19/20 |
| 2018/0218535 A1* | 8/2018 | Ceylan | G06T 7/13 |
| 2019/0018907 A1* | 1/2019 | He | G06F 17/50 |

* cited by examiner

*Primary Examiner* — Ke Xiao
*Assistant Examiner* — Jed-Justin Imperial
(74) *Attorney, Agent, or Firm* — Jones Day

(57) ABSTRACT

Computer-implemented systems and methods for updating a polygonal mesh representation of a model are provided. A model comprises a set of topologies, and a meshing state is maintained for each topology of the set of topologies. The meshing state indicates, for a given topology, whether a polygonal mesh exists and is valid. A change made to the model is determined, where the change comprises a modification to a geometry of the model or a modification to mesh settings of a polygonal mesh representation of the model. One or more topologies of the set of topologies that are affected by the change are determined, and the meshing state for the affected one or more topologies is updated. Based on the one or more updated meshing states, a set of meshing operations needed to bring the polygonal mesh representation of the model up-to-date is determined.

20 Claims, 9 Drawing Sheets

SYSTEMS AND METHODS FOR EFFICIENT UPDATING OF AN ANALYSIS MESH

CROSS-REFERENCE TO RELATED APPLICATIONS

This application claims priority to U.S. Provisional Application No. 62/458,198, filed Feb. 13, 2017, entitled "Systems and Methods for Efficient Updating of an Analysis Mesh," which is incorporated herein by reference in its entirety.

FIELD

The present description relates to computer-based techniques for updating a polygonal mesh representation of a model.

BACKGROUND

Computer-aided design is commonly used to model physical (e.g., real-world) objects. For example, data associated with a physical object (e.g., material properties, dimensions, etc.) may be used to create a model of the physical object that comprises a virtual three-dimensional (3D) object. A boundary representation (B-Rep) CAD model is an example of such a model and generally includes a collection of surfaces that are organized topologically in boundary loops. The B-Rep CAD model may further include additional geometrical and topological information that represents surface domains in the CAD model. Other types of models, such as a faceted geometry model, are also commonly used to model physical objects. To perform certain analyses of the model (e.g., finite element analysis, etc.), it is common to generate a polygonal mesh representation of the model. Using the polygonal mesh representation, various computer-based analyses can be performed, and the physical object may be built or modified based on such analyses.

SUMMARY

Computer-implemented systems and methods for updating a polygonal mesh representation of a model are provided. In a computer-implemented method for updating a polygonal mesh representation of a model, a model is displayed via a graphical user interface (GUI) of a computer-aided design modeling system. The model comprises a set of topologies, and a meshing state is maintained for each topology of the set of topologies. The meshing state indicates, for a given topology, whether a polygonal mesh exists and is valid. A change made to the model via the GUI is determined, where the change comprises a modification to a geometry of the model or a modification to mesh settings of a polygonal mesh representation of the model. One or more topologies of the set of topologies that are affected by the change are determined, and the meshing state for the affected one or more topologies is updated. Based on the one or more updated meshing states, a set of meshing operations needed to bring the polygonal mesh representation of the model up-to-date is determined. The set of meshing operations is performed to update the polygonal mesh representation of the model.

A system for updating a polygonal mesh representation of a model includes a processing system and computer-readable memory in communication with the processing system encoded with instructions for commanding the processing system to execute steps. In executing the steps, a model is displayed via a graphical user interface (GUI) of a computer-aided design modeling system. The model comprises a set of topologies, and a meshing state is maintained for each topology of the set of topologies. The meshing state indicates, for a given topology, whether a polygonal mesh exists and is valid. A change made to the model via the GUI is determined, where the change comprises a modification to a geometry of the model or a modification to mesh settings of a polygonal mesh representation of the model. One or more topologies of the set of topologies that are affected by the change are determined, and the meshing state for the affected one or more topologies is updated. Based on the one or more updated meshing states, a set of meshing operations needed to bring the polygonal mesh representation of the model up-to-date is determined. The set of meshing operations is performed to update the polygonal mesh representation of the model.

A non-transitory computer-readable storage medium for updating a polygonal mesh representation of a model comprises computer executable instructions which, when executed, cause a processing system to execute steps. In executing the steps, a model is displayed via a graphical user interface (GUI) of a computer-aided design modeling system. The model comprises a set of topologies, and a meshing state is maintained for each topology of the set of topologies. The meshing state indicates, for a given topology, whether a polygonal mesh exists and is valid. A change made to the model via the GUI is determined, where the change comprises a modification to a geometry of the model or a modification to mesh settings of a polygonal mesh representation of the model. One or more topologies of the set of topologies that are affected by the change are determined, and the meshing state for the affected one or more topologies is updated. Based on the one or more updated meshing states, a set of meshing operations needed to bring the polygonal mesh representation of the model up-to-date is determined. The set of meshing operations is performed to update the polygonal mesh representation of the model.

The subject matter described herein provides many technical advantages. As described below, the computer-based techniques of the present disclosure improve the functioning of a computer system as compared to conventional approaches because the techniques described herein enable the updating of a mesh (e.g., an analysis mesh, etc.) in a manner that is more efficient (e.g., faster, with smaller memory requirements, etc.) and/or has a reduced processing burden as versus conventional approaches. The computer-based techniques described herein achieve such improvements through the use of processes that provide selective remeshing of subregions of a mesh when a change is made to an underlying model. The change to the underlying model may be, for example, a modification of the geometry of the underlying model or a modification of mesh settings or mesh controls of a polygonal mesh representation of the underlying model. By remeshing only the selected subregions and not remeshing the entire model, the mesh is brought up-to-date in an efficient manner that is faster and/or requires smaller memory or processing resources as compared to the conventional approaches. Further, by updating the mesh in the efficient manner described herein, a display of the mesh presented via a graphical user interface (GUI) may be updated in real-time or near real-time, such that the display is updated at substantially the same time that the change to the underlying model is made. These technical advantages and others of the present disclosure are described in detail below.

The details of one or more variations of the subject matter described herein are set forth in the accompanying drawings and the description below. Other features and advantages of the subject matter described herein will be apparent from the description and drawings, and from the claims.

DETAILED DESCRIPTION

Figure 1:
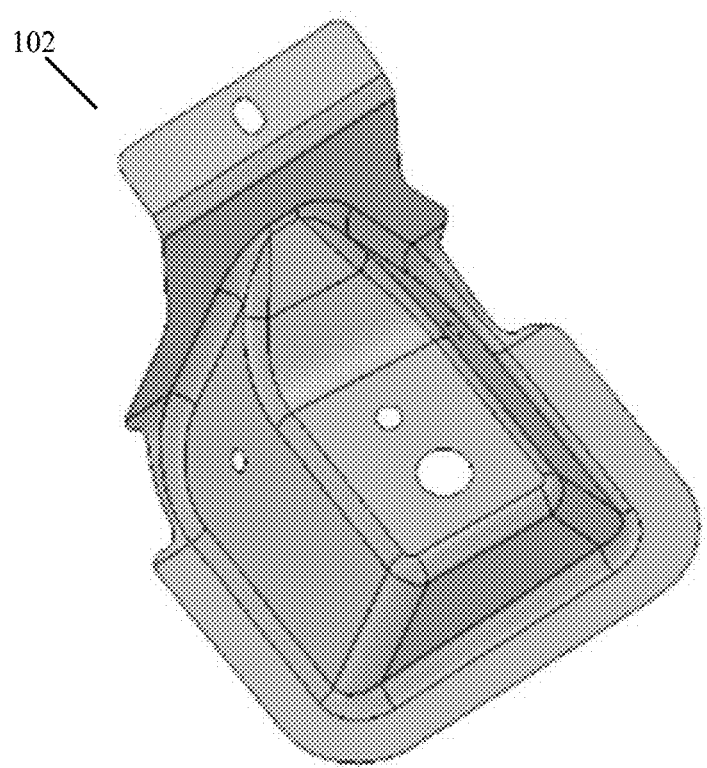
FIGS. 1 and 2A illustrate a model and a polygonal mesh representation of the model, respectively, in accordance with embodiments of the present disclosure.

The present disclosure relates generally to computer-based techniques for updating a polygonal mesh representation of a model. As described above, computer-based models are commonly used to model physical (e.g., real-world) objects. The computer-based models include, for instance, B-Rep models and faceted geometry models, among others. To perform certain analyses of a computer-based model (e.g., finite element analysis, etc.), a polygonal mesh representation of the model may be generated. As referred to herein, a polygonal mesh representation is a piecewise discretization of a given model (e.g., a given CAD model). The polygonal mesh representation may comprise, for instance, a triangular mesh or other type of mesh, and various computer-based analyses can be performed using the mesh.

Computer-aided design modeling systems commonly provide a graphical user interface (GUI) that enables a user to make changes to the model. For instance, the GUI may enable the user to make various changes to the geometry of the model (e.g., moving faces of the model's geometry, changing a thickness of a portion of the geometry, etc.). In conventional approaches, when the model is changed, the polygonal mesh representation of the model is cleared and subsequently regenerated anew. In generating the new polygonal mesh representation that is up-to-date and thus in accordance with the changed model, the entire model is remeshed in the conventional approaches. Remeshing of the entire model can be a time-consuming and/or computationally expensive process and may require significant processing and/or memory resources. Further, in the conventional approaches, a display of the polygonal mesh representation provided via the GUI may be out-of-date for a significant amount of time while the remeshing is being performed.

The present inventors have observed a need for improved techniques for updating a polygonal mesh representation of a computer-based model. Specifically, the present inventors have observed a need for computer-based techniques that enable the polygonal mesh representation and a display thereof to be updated in an efficient manner. The present inventors have further observed that such techniques should be implemented in a computer-based modeling system that provides (i) immersive GUI controls that enable a user to easily make changes to the underlying model (e.g., by selecting faces of the model and dragging the selected faces to make changes, etc.), (ii) mesh calculations that can be interrupted (e.g., interrupted when additional changes to the underlying model are made, etc.), such that the mesh is brought up-to-date in the most efficient manner, (iii) remeshing of only a smallest portion of the mesh that is necessary to bring the mesh up-to-date with a changed model, (iv) efficient restartability of meshing calculations, and (v) separation of any user notion of exactly where the meshing is occurring (e.g., meshing can be implemented locally on one or more CPU cores or on a remote distributed server without the user being aware of where the meshing is occurring).

Embodiments of the present disclosure are directed to computer-implemented systems and methods that may satisfy one or more of these needs. Accordingly, the present disclosure provides computer-implemented systems and methods for efficiently updating a polygonal mesh representation of a model. As described in further detail below, the computer-implemented systems and methods described herein provide, among other features, selective remeshing of subregions of a mesh when a change to an underlying model occurs. This is in contrast to the conventional approaches described above, which require remeshing of the entire model when a change is made to the model. By remeshing only the selected subregions and not remeshing the entire model, the mesh is brought up-to-date in an efficient manner that is faster and/or requires smaller memory and processing resources as compared to the conventional approaches.

Additionally, by updating the mesh in the efficient manner described herein, a display of the mesh presented via a GUI may be updated in real-time or near real-time, such that the display is updated at substantially the same time that the change to the underlying model is made. Embodiments of the present disclosure are implemented in the context of a direct 3D solid modeling application, such as the ANSYS SpaceClaim Direct Modeler. Such direct modelers, which are in contrast to history-based modeling applications, may provide a framework for implementing one or more of the computer-based techniques described herein.

Figure 2A:
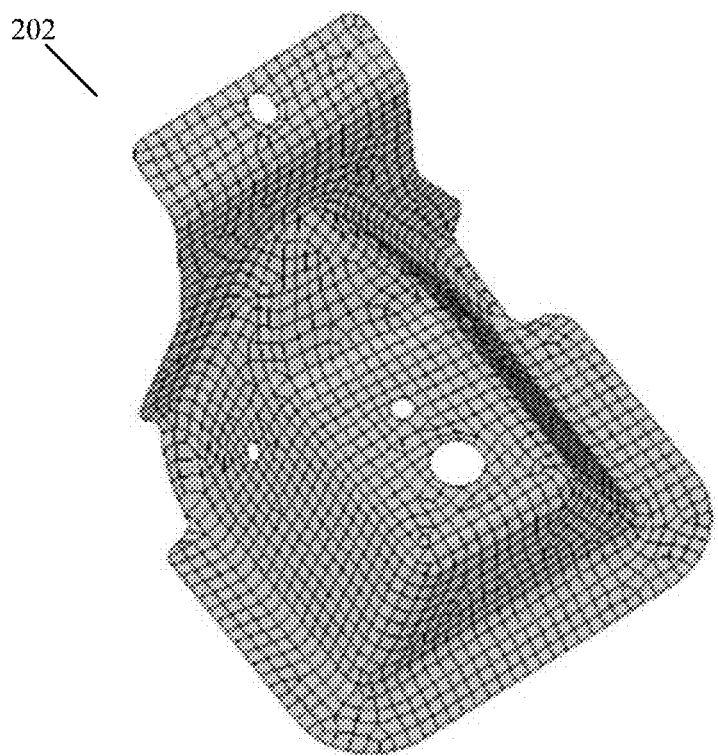

To illustrate features of the computer-implemented systems and methods described herein, reference is made to FIGS. 1 and 2A. These figures illustrate a model 102 and a polygonal mesh representation 202 of the model, in accordance with embodiments of the present disclosure. In embodiments, a user may start out with a model, such as the model 102 of FIG. 1, which contains no meshing data. The model 102 may be, for instance, a 3D B-Rep model, a faceted geometry model, or another type of imported from various CAD sources or created-from-scratch model. Further, the model may be displayed via a GUI of a computer-implemented modeling system and may comprise a set of topologies. As referred to herein, a set of topologies comprises vertices, edges, faces, and bodies in a computer-aided design (CAD) model along with the connections between the various vertices, edges, faces, and bodies. A CAD model comprises a set of topologies that is mathematically defined by a geometry.

The model may be as simple as a single part or as complex as all the parts and assemblies that make up an aircraft engine, for instance. The user's goal, for either case, is to generate a polygonal mesh representation of the model, such as the mesh 202 of FIG. 2A, so that the mesh representation can be used to perform a specific analysis on the model. In embodiments of the present disclosure, the user can select the entire body or all of the bodies in the entire model to mesh. Thus, for instance, by selecting the entire body of the model 102 of FIG. 1 or all bodies in the model 102 for meshing, the polygonal mesh representation 202 of FIG. 2 may be generated. Further, it is important to note that connections between parts in assemblies are determined automatically as appropriate to the mesh and physics in question, so as to most efficiently merge (and not cause to analyze separately) in the mesh, faces that should be treated as one for analysis purposes.

Figure 2B:
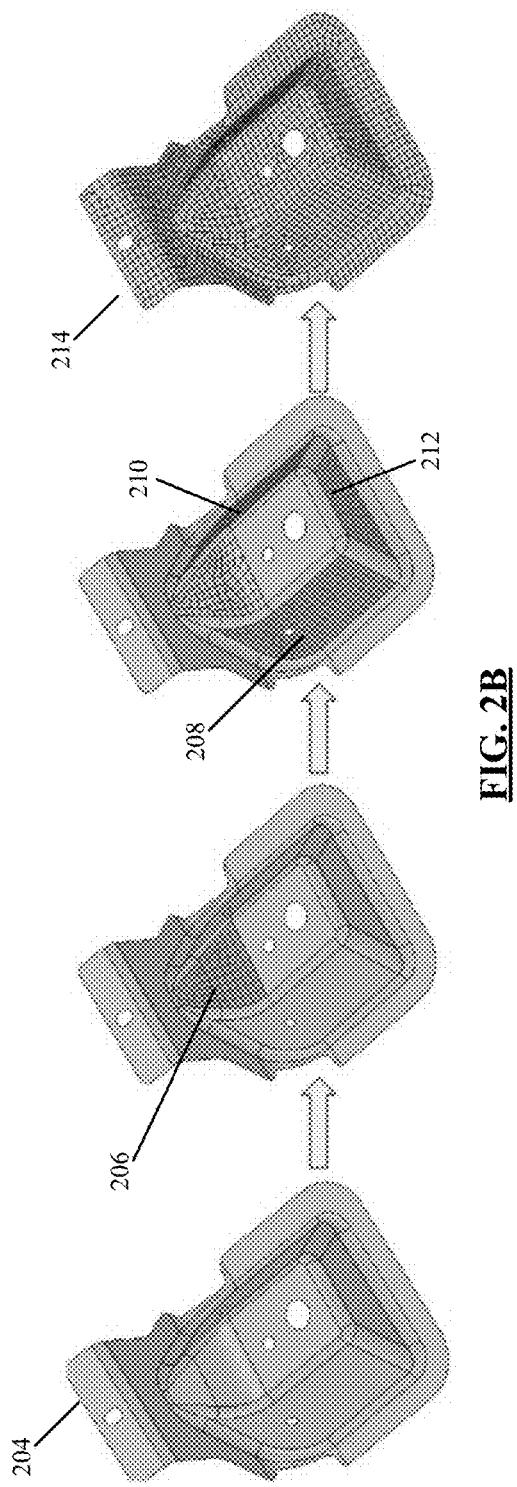
FIG. 2B illustrates an example process by which faces of the model illustrated in FIG. 1 are selected for meshing, according to embodiments of the present disclosure.

Another approach to generating the mesh 202 is to select the individual faces of the model 102 to mesh first and build up the mesh 202 from there. In other words, in embodiments of the present disclosure, the user is able to start with a group of faces of the model 102 to mesh and can then add more faces of the model 102 to mesh. After these faces have been meshed, the user can select the body to mesh and any face that has not been meshed is then generated. The faces that were already meshed will not be regenerated. An example of this approach is illustrated in FIG. 2B. The original model 102 of FIG. 1 with no meshing is illustrated at 204. Subsequently, a face 206 is selected and meshed. After the meshing of the face 206, additional faces 208, 210, 212 are selected and meshed, as shown in the figure. The user can subsequently select the body for meshing or can continue selecting individual faces to complete the mesh, as shown at 214.

After completing the initial mesh of the model 102 (e.g., as shown at mesh 202 in FIG. 2A and mesh 214 in FIG. 2B), the user may make a change to the model 102. The change can be, for instance, a change to the geometry of the body of the model 102. Other types of changes may be made, as described below. With the change being made to the model 102, the polygonal mesh representation of the model 102 should likewise be updated. As described above, in conventional approaches, the previously generated mesh is cleared, and the entire model is remeshed. In contrast to the conventional approaches, in embodiments of the present disclosure, remeshing of only the area of the model that is modified is performed. To illustrate this, reference is made to FIGS. 3 and 4. These figures illustrate a change made to a face of the model shown in FIG. 1 and a subsequent remeshing of only the changed face, in accordance with embodiments of the present disclosure.

Figure 3:
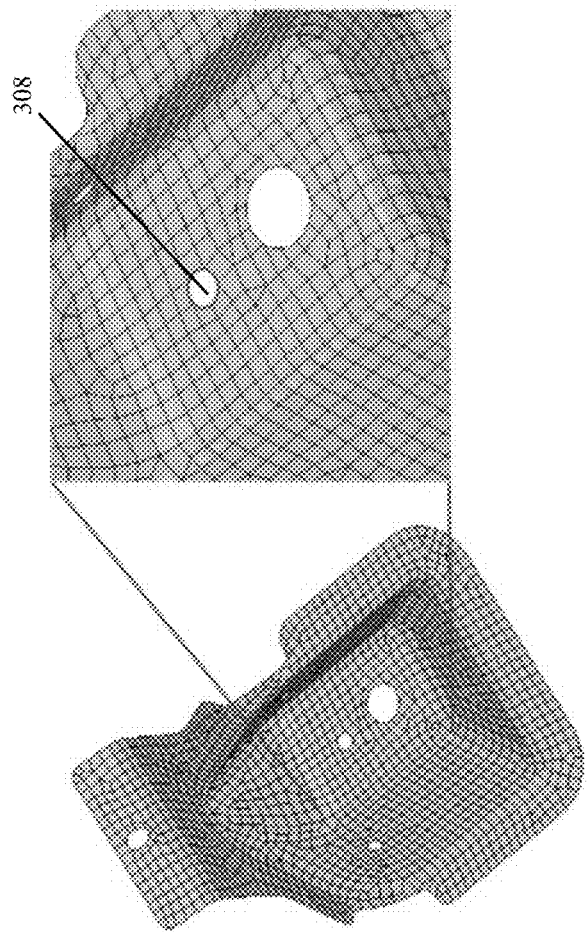
FIGS. 3 and 4 illustrate a change (removal of topology) made to a face of the model shown in FIG. 1 and a subsequent remeshing of the changed face, in accordance with embodiments of the present disclosure.
Figure 4:
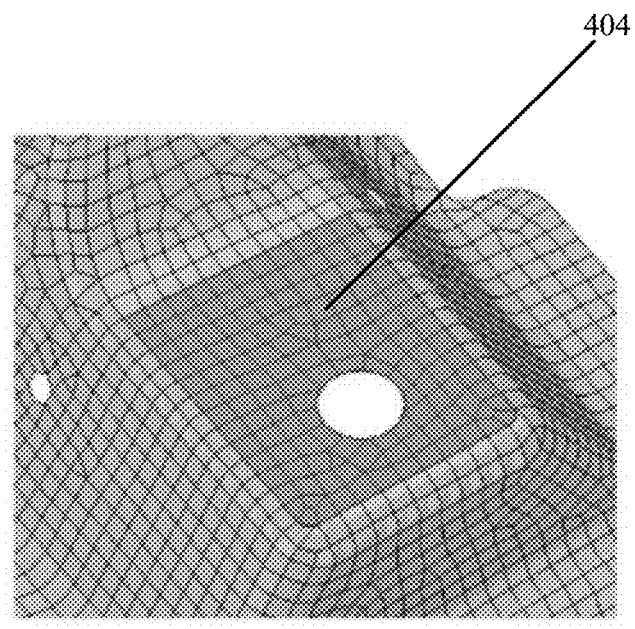
Figure 5:
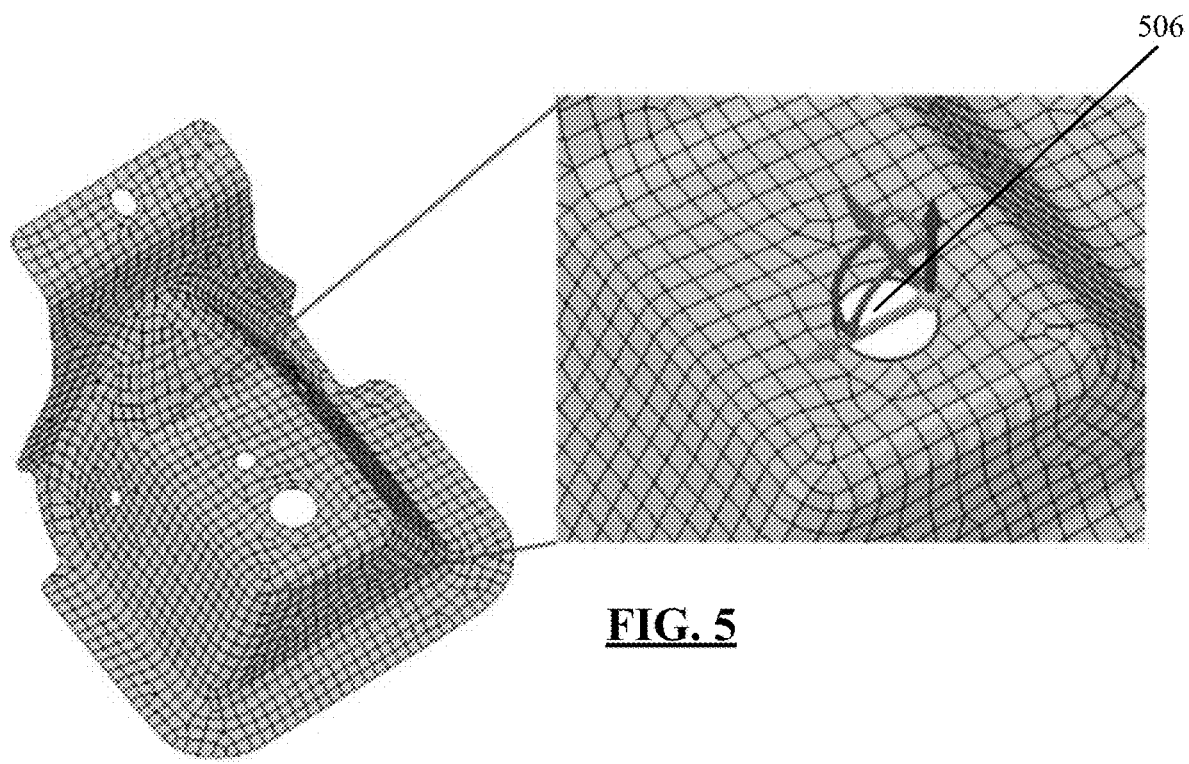
FIGS. 5 and 6 illustrate another change (movement of topology) made to the face of the model shown in FIG. 1 and a subsequent remeshing of the changed face, in accordance with embodiments of the present disclosure.
Figure 6:
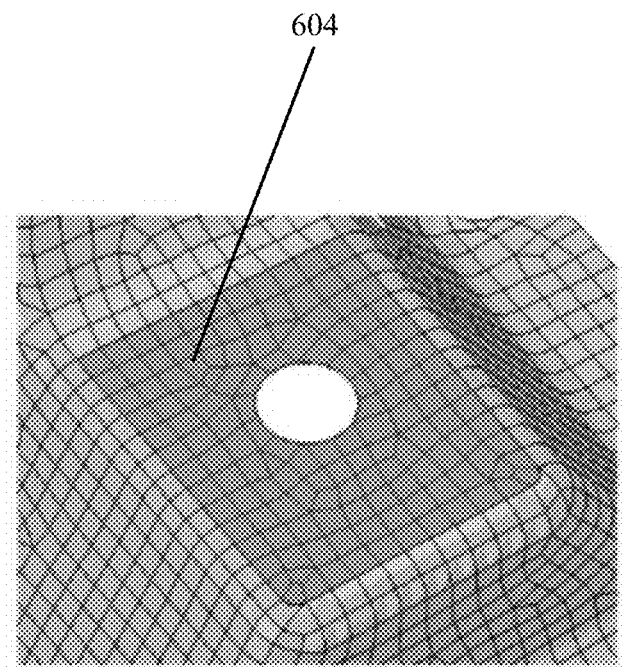

In particular, in FIG. 3, the user may wish to fill a small hole 308 to simplify the model. In embodiments of the present disclosure, the user is able to do so via intuitive GUI controls that enable the user to easily make this change. When the user fills the small hole 308 of the model, the polygonal mesh representation of the model is brought up-to-date, as described above. The techniques of the present disclosure enable the mesh to be brought up-to-date by meshing only the face 404 shown in FIG. 4. The face 404 that is remeshed is the portion of the model that was affected by the user's change, and an entirety of the model is not remeshed. Similarly, in the example of FIGS. 5 and 6, the user may wish to center the larger hole 506 on the face. Using the techniques of the present disclosure, only the face 604 that was modified when the hole was moved is remeshed (e.g., regenerated), and the rest of the body is not remeshed.

The examples of FIGS. 3-6 illustrate that the user may change a geometry of the model, and the polygonal mesh associated with the model is updated in an efficient manner. In embodiments of the present disclosure, the user is also able to change the model by modifying mesh controls and settings of the polygonal mesh representation of the model. Specifically, the user has the ability to create local size controls and settings (in addition to the aforementioned body-specific mesh settings) in order to achieve a desired mesh or to fix areas of the mesh that need adjustments, and these settings and controls are directly attached to a geometry topology in the model. When such mesh controls and settings are modified, the polygonal mesh representation is brought up-to-date in an efficient manner. To illustrate this, reference is made to FIGS. 7A-7C and 8A-8C. These figures illustrate a modification of mesh settings of a polygonal mesh representation of a model and a subsequent remeshing of affected portions of the mesh, in accordance with embodiments of the present disclosure.

Figure 7A:
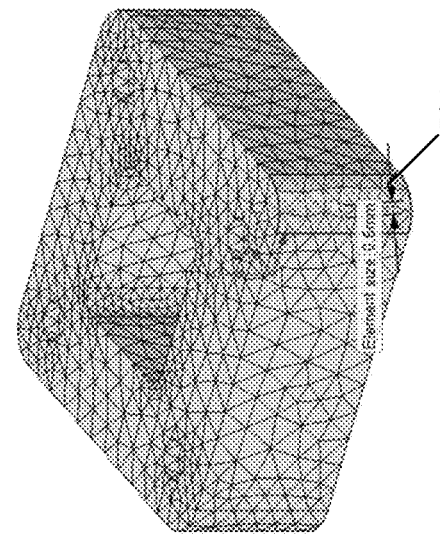
FIGS. 7A-7C illustrate a modification of mesh settings for a single face of a polygonal mesh representation of a model and a subsequent remeshing of affected portions of the mesh, in accordance with embodiments of the present disclosure.
Figure 7B:
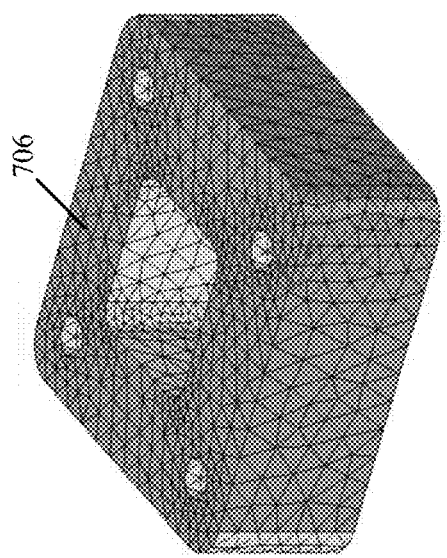
Figure 7C:
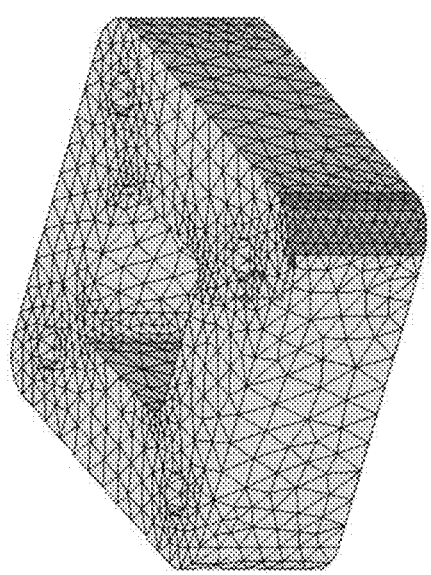

In particular, in FIG. 7A, a user input may specify via the GUI that an element size of the mesh should be changed on the round corner face 704. Subsequently, the computer-based algorithms of the present disclosure determine portions of the model that are affected by the element size change. In this example, it is determined that the round corner face 704 and faces that are adjacent to the round corner face 704, as denoted by the darker-colored portions 706 in FIG. 7B, are affected by the change. The round corner face 704 and the adjacent faces may be tagged with an appropriate tag (e.g., "NeedsMeshed"), and the polygonal mesh representation is then brought up-to-date by remeshing only these particular subregions. The resultant updated mesh is shown in FIG. 7C.

Figure 8A:
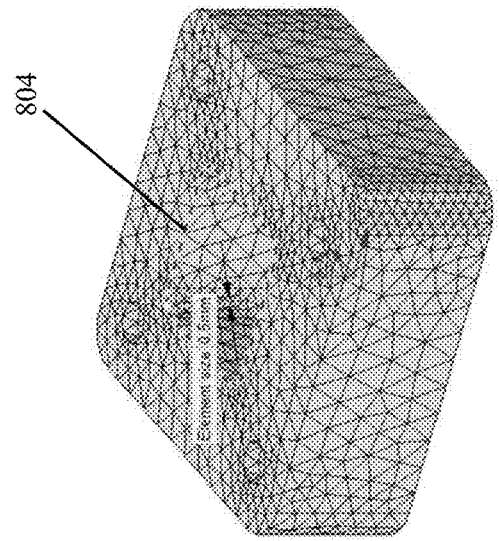
FIGS. 8A-8C illustrate another modification of mesh settings for a loop of edges of a polygonal mesh representation of a model and a subsequent remeshing of affected portions of the mesh, in accordance with embodiments of the present disclosure.
Figure 8B:
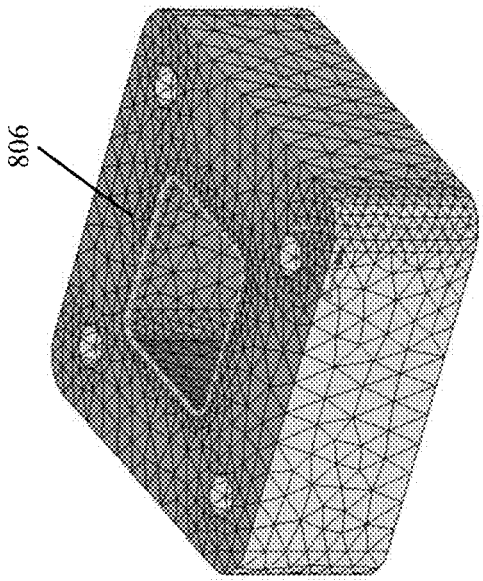
Figure 8C:
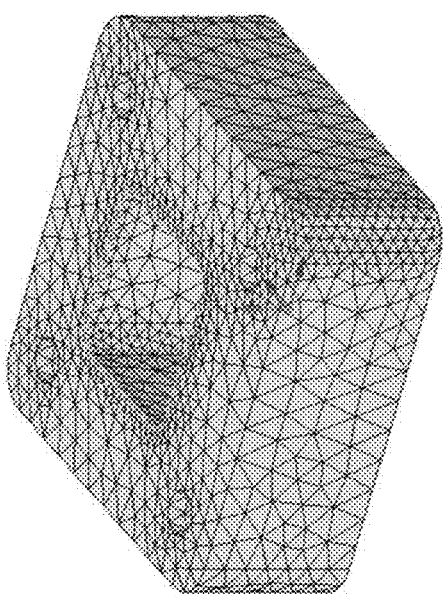

Similarly, in FIG. 8A, a user input may specify that an element size of the mesh should be changed on the edge loop 804. The computer-based algorithms of the present disclosure then determine portions of the model that are affected by the element size change. In this example, it is determined that faces adjacent to the edge loop 804, as denoted by the darker-colored portions 806 in FIG. 8B, are affected by the change. These faces may be tagged with an appropriate tag, and the polygonal mesh representation is then brought up-to-date by remeshing only these particular subregions. The resultant updated mesh is shown in FIG. 8C.

By updating meshes in the efficient manner described above with reference to FIGS. 1-8C, a display of the mesh presented via a GUI may be updated in real-time or near real-time, such that the display is updated at substantially the same time that the change to the underlying model is made. Further, in some embodiments, the updating of the mesh display is accelerated further by updating only portions of the display. For instance, in embodiments where only a subregion of the model is remeshed (i.e., without remeshing an entirety of the model), the display of the mesh presented via the GUI may be updated in only the remeshed subregion. The rest of the display is not updated, thus accelerating the updating and providing the user with the updated display in a relatively short amount of time after the change to the model was made. The efficient updating of the display is described in further detail below.

Figure 9:
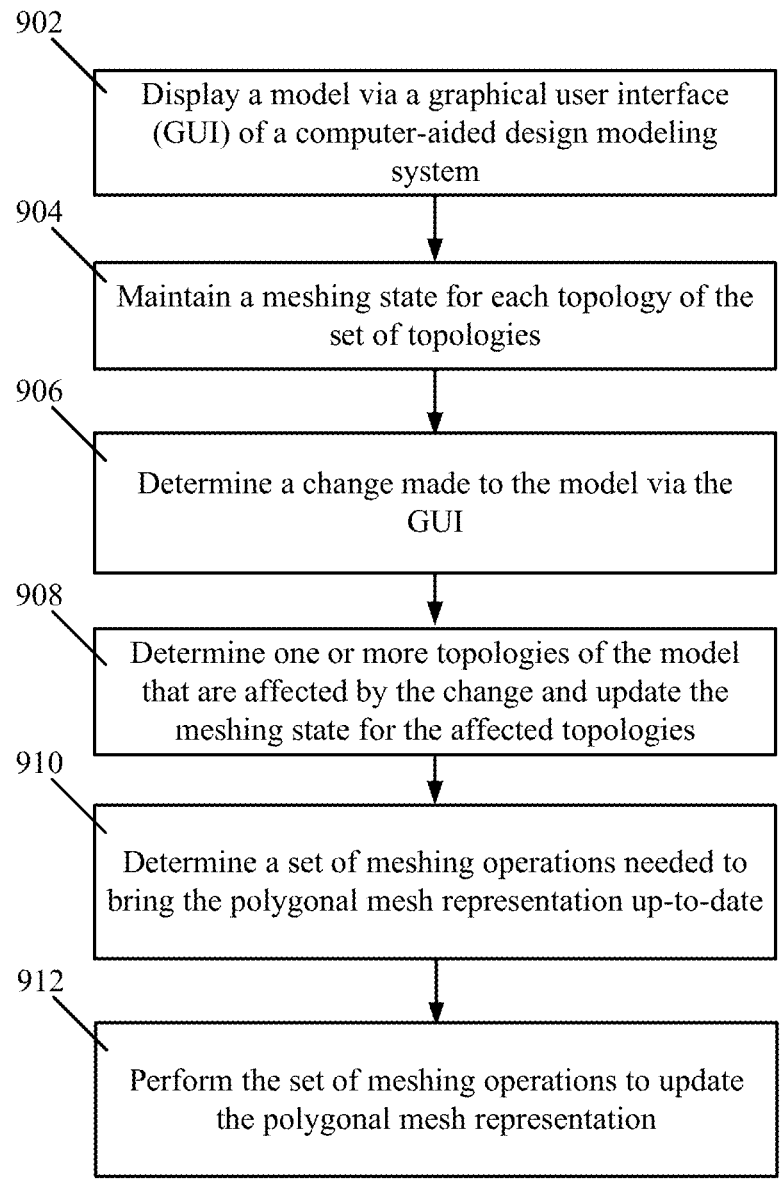
FIG. 9 is a flowchart including exemplary operations of a computer-implemented method for updating a polygonal mesh representation of a model, according to embodiments of the present disclosure.

To implement the technical advantages of the present disclosure, the computer-implemented operations of FIG. 9 are utilized, in embodiments. It is noted that in embodiments, some of the steps of FIG. 9 are performed simultaneously and not necessarily sequentially, and that in embodiments, the ordering of the steps varies from that depicted in the figure. At 902, the model is displayed via a GUI of a computer-aided design, direct modeling system. In embodiments, the model comprises a 3D B-Rep model or a faceted geometry model that includes a set of topologies. The set of topologies comprises vertices, edges, faces, and bodies in a computer-aided design model and connections between the vertices, edges, faces, and bodies.

At 904, a meshing state is maintained for each topology of the set of topologies. The meshing state indicates, for a given topology, whether a polygonal mesh exists and is valid (e.g., up-to-date and in accordance with the model). Example meshing states include "Empty" (e.g., indicating that no mesh operation has been executed), "NeedsMeshed" (e.g., indicating that a mesh exists but is out of date), and "Dirty" (e.g., indicating that a geometry was modified on a topology that was previously meshed), among others. At 906, a change made to the model via the GUI is determined, where the change comprises a modification to a geometry of the model or a modification to mesh settings or controls of a polygonal mesh representation of the model. Exemplary changes that can be made to the model by a user via the GUI are described above with reference to FIGS. 3-8C.

At 908, one or more topologies of the set of topologies that are affected by the change are determined, and the meshing states for the affected topologies are updated. As described in further detail below, when a change is made to one area of the model, the change may affect to other areas of the model. Accordingly, to determine the topologies affected by the change, the computer-implemented techniques described herein are configured to analyze the change and determine all parts of the model that are affected by the change. At 910, based on the one or more updated meshing states, a set of meshing operations needed to bring the polygonal mesh representation up-to-date is determined.

At 912, the set of meshing operations are performed to update the polygonal mesh representation of the model. In embodiments, the performing of the set of meshing operations includes remeshing a subregion of the polygonal mesh representation, as specified by the set of meshing operations, without remeshing an entirety of the model. The remeshed subregion corresponds to the topologies of the model affected by the change. Additionally, in embodiments, the polygonal mesh representation is displayed via the GUI. After performing the set of meshing operations to update the mesh, the display is updated in real-time or near real-time such that the display is updated at substantially the same time that the change is made. Further, in embodiments where only a subregion of the model is remeshed, the display of the polygonal mesh representation is updated only in the remeshed subregion. The updating of portions of the display is described in further detail below.

Additionally, in accordance with embodiments of the present disclosure, a physical object may be built or modified. Specifically, in embodiments, physical data (e.g., material properties, dimensions, etc.) associated with a physical object are used in generating the model described above. In these embodiments, the model comprises a virtual 3D object that is used in modeling the physical object. The polygonal mesh representation of the model is generated and updated according to the approaches described herein, and a computer-based analysis of the polygonal mesh representation is performed. The computer-based analysis may be, for instance, a finite element analysis or another type of analysis. Subsequently, the physical model may be built or modified based on the computer-based analysis.

Figure 10:
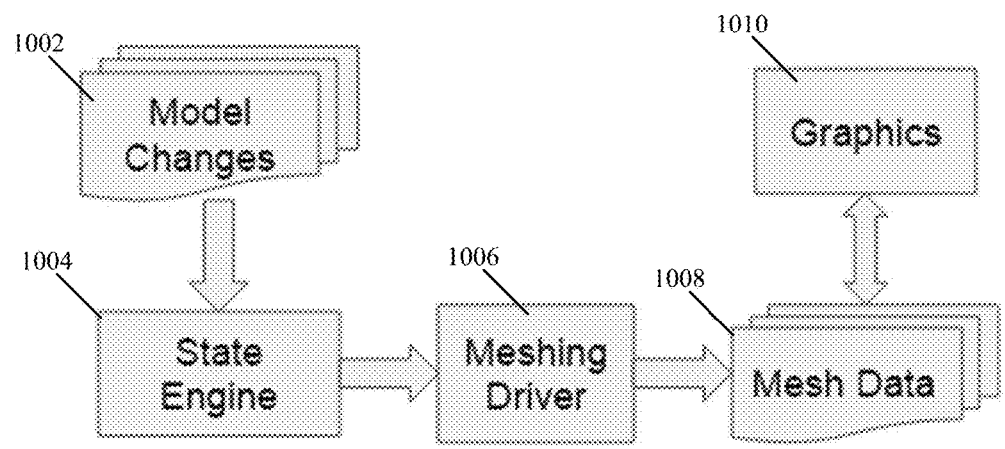
FIG. 10 illustrates an example workflow for interactive meshing of a model, in accordance with embodiments of the present disclosure.

To further describe the computer-based techniques of the instant disclosure, reference is made to FIG. 10. This figure illustrates an example workflow for interactive meshing of a model, in accordance with embodiments of the present disclosure. In embodiments, the meshing process comprises a reactive system where changes to the model 1002 trigger a state change of the topology that was modified. A state engine 1004 receives the model changes 1002, evaluates what was changed, and determines the scope of the changes 1002 and how the changes 1002 should be propagated to other areas of the model. Thus, at a high level, the state engine 1004 comprises software that stores meshing states for respective topologies and propagates meshing states based on certain criteria (e.g., a topology hierarchy, etc.). A meshing driver 1006 consumes the state changes from the state engine 1004 and determines what meshing operation should be executed to bring the mesh up to date. Instead of the entire model being remeshed, only the topology that was changed, and the smallest possible topological set of dependent objects, will be remeshed. Once the modified area is changed, a graphics engine 1010 also reacts to update the mesh in only the changed areas based on mesh data 1008.

The model changes 1002 include changes made to the geometry, mesh settings, or mesh controls. Geometry changes have a direct connection to the state engine 1004 so that when any change is made to the geometry, the state is updated. Changes to mesh settings and controls also have a connection to the state engine 1004. In particular, these settings and controls are tied to geometry, and when the control is changed, the corresponding dependent geometry is then marked as modified in the state engine 1004.

The meshing driver 1006 consumes data from the state engine 1004 (e.g., state changes) and decides what operations should be performed to bring the mesh up to date. This is determined based on a current state of the topology. If a topology has no mesh, then the driver 1006 will create a new mesh for the topology. But if an existing mesh already exists, the driver 1006 determines the subregion to mesh based on the meshing state of the topology. If the driver 1006 determines that the entire body needs to be updated, then the mesh is cleared and the mesh is created anew. At this point, the meshing data 1008 is made available to the graphics engine 1010 so that the mesh can be rendered (e.g., displayed at the GUI for viewing by a user).

While the mesh is being generated, the meshing driver 1006 notifies the graphics engine 1010 that a mesh was updated on a part, and the graphics engine 1010 updates the graphics for the part. Instead of updating the entire model every time the mesh is modified, only the parts that were changed are updated. Utilizing the state engine's state handle, it can be determined what was changed since the last handle was created. This isolates what areas need to be updated, which results in a more efficient process.

The state engine 1004 maintains the meshing state for individual topologies. Whenever there is a geometric modeling change or a mesh control change in the GUI, the state engine 1004 is informed about the change, and a corresponding tag is set on the relevant topology to indicate that the state has been modified. Examples of the tags used to describe the state of the topology are Meshed, Dirty, Active, Inflated, and Connected, among others. Each tag has its own interpretation and is later used to drive specific meshing algorithms.

When a topology is set with a meshing state, it is propagated to associated topologies based on a predefined propagation type associated to the input state. There are four types of propagations: "propagate to parents," "propagate to children," "propagate to parent and children," and "no propagation." Parent and children for a topology are derived from a topological hierarchy. The state of the parent is determined from the state of its children. If no children are present, then the state is set as per input. As an example, if a body is set to state "Meshed," all of its faces (in this case) children have a mesh tag set. Later, if any of the children have a modified tag set, the state engine 1004 automatically sets the state of the body to be "Needs Meshed." For optimization, only the topologies that have relevance to meshing are tracked. In addition to state data, the state engine 1004 also holds information corresponding to deleted topologies, connected topologies and their relationship with other topologies, and information or error messages associated to specific topologies, among other information.

The state engine 1004 is the connection between a possibly-changed model and the meshing driver 1006. Updates are triggered using the system's global state identifier of the UpdateState, as follows. The system containing multiple geometry/topology objects and associated mesh control settings maintains a unique global state identifier (e.g., UpdateState). All the contained objects in this system, at their creation, remember this identifier. If any transaction/event results in modification to any of the contained objects, the system's global update state changes, and all the modified objects during that transaction update their copy of update state to the current system update state.

Any external system that needs to react to changes to such objects initially stores a snapshot of update states of referred individual objects as a unique timestamp. When it needs to check the source state during next update, the recorded snapshot of update states is compared with current snapshot to determine whether the changes are significant to trigger a self-update.

The meshing driver 1006 contains and implements algorithms to make smart meshing/remeshing decisions based on GUI input and data from the state engine 1004. Whenever there is a topological modification or mesh control change, a mesh update is triggered. During a mesh update, the meshing driver 1006 compiles all of the input from the GUI and queries the state engine 1004 to collect all topological state change information. This data is then used to determine various mesh operations and meshing algorithms to be used during mesh generation. A mesh operation is a high level indicator to determine which meshing algorithms are to be invoked. Some examples of mesh operations are "CreateMesh," "SubRegionMesh," VolumeFill," etc. The "CreateMesh" operation is used to generate a mesh in an unmeshed topology. The "SubRegionMesh" operation is used to determine a small area of the mesh by extracting a subset of the mesh and applying meshing algorithms to only the subset. Later, this subset of mesh is assimilated back into the original mesh. The "VolumeFill" operation is used for filling a watertight surface mesh with 3D elements like tetrahedrons. All mesh operations on independent topologies like parts and bodies are performed in parallel (as much as possible, given connectedness {non-parallelizable} constraints as mentioned in [0022]), and corresponding mesh graphics are updated as individual operations are completed.

As described above, the meshing driver 1006 determines what mesh operations to perform based on changes that are made to the underlying model. To further illustrate example determinations that are made by the meshing driver 1006, reference is made to FIG. 11. This figure illustrates an example computer-implemented algorithm for determining a set of meshing operations needed to bring a polygonal mesh representation of a model up-to-date, in accordance with embodiments of the present disclosure. The meshing driver 1006 receives information on the changes 1102 that were made to the model and subsequently makes a number of decisions based on what was changed.

Figure 11:
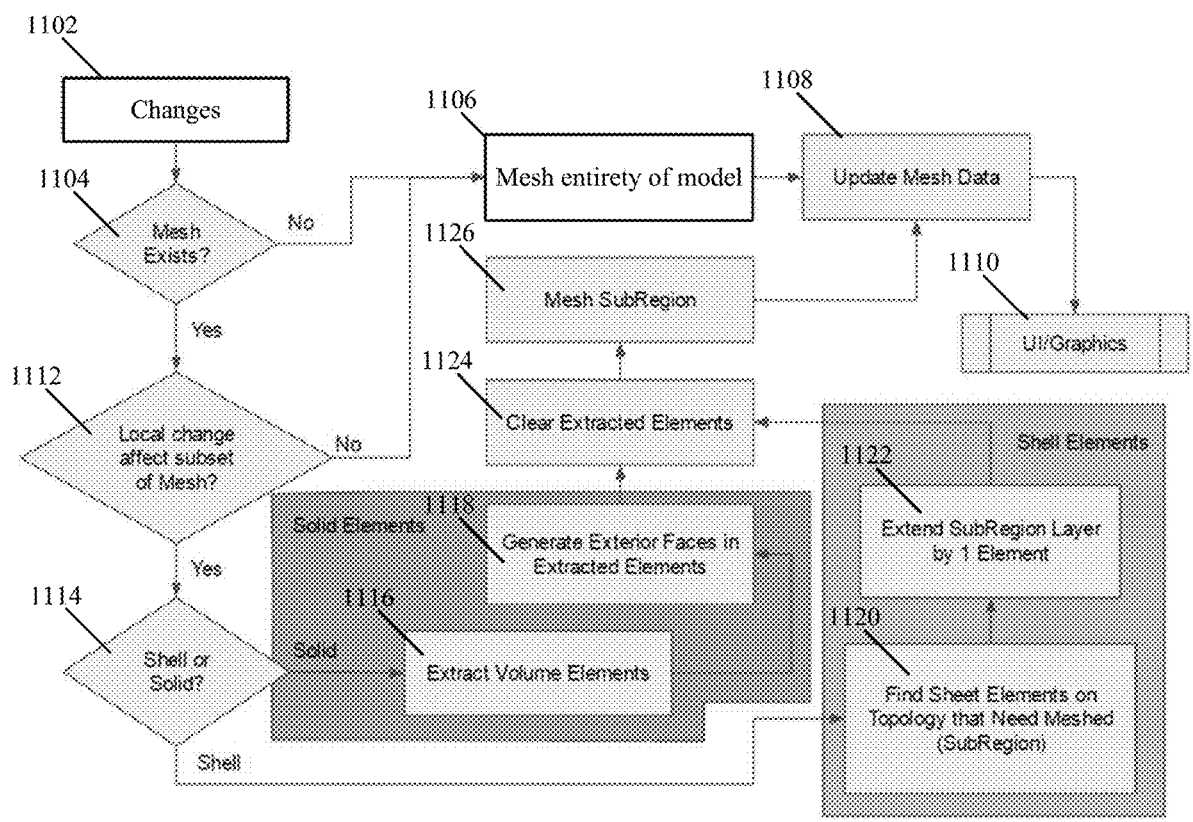
FIG. 11 illustrates an example computer-implemented algorithm for determining a set of meshing operations needed to bring a polygonal mesh representation of a model up-to-date, in accordance with embodiments of the present disclosure.

As illustrated in FIG. 11, at step 1104, the meshing driver 1006 determines if a mesh currently exists. If a body does not already have a mesh, then the decision is simple, and a mesh is created on the body. Thus, FIG. 11 shows that when it is determined at step 1104 that a mesh does not exist, the algorithm proceeds to step 1106, where an entirety of the model is meshed. Based on the meshing of the model, mesh data is updated at step 1108, and the graphics engine 1110 reacts to provide a display of the generated mesh based on the updated mesh data.

Conversely, if it is determined at step 1104 that a mesh has already been generated, the meshing driver 1006 determines what was modified and whether a change was made that requires a full remesh. An example of a change that may result in a full remesh may be when a user changes the default element shape within the model. Thus, at step 1112, the meshing driver 1006 determines whether the change is merely a "local change" that affects only a subregion of the mesh, or whether the change is one that affects an entirety of the mesh and thus requires a full remesh. If it is determined at the step 1112 that the change is not a local change, the flowchart proceeds to steps 1106 and 1108, described above. Otherwise, if it is determined at step 1112 that the change is a local change not requiring a full remesh, then only a subregion of the mesh will be updated, and the flowchart proceeds to step 1114.

At step 1114, a determination is made as to whether the body comprises a shell or a solid. If it is determined at step 1114 that the body is a solid, then the flowchart proceeds to step 1116, where the interior volume elements within the bounded subregion are extracted. Next, at step 1118, the exterior faces of these extracted elements are generated based on the topology that was modified. If it is determined at the step 1114 that the body is a shell body, then the flowchart proceeds to step 1120, where only the sheet elements are extracted around the topology that was modified, and a subregion is created. Next, at step 1122, from this subregion, the region is extended into the adjacent faces by one element.

At this point for both cases (e.g., cases for solid and shell bodies, respectively), only the subregion of the mesh containing the modified topology is extracted. At step 1124, this subregion is then cleared of all its elements, and at step 1126, the subregion is meshed. At the step 1108, the new meshed subregion is then replaced in the meshing data, and the graphics engine 1110 is notified that an update is available.

Figure 12A:
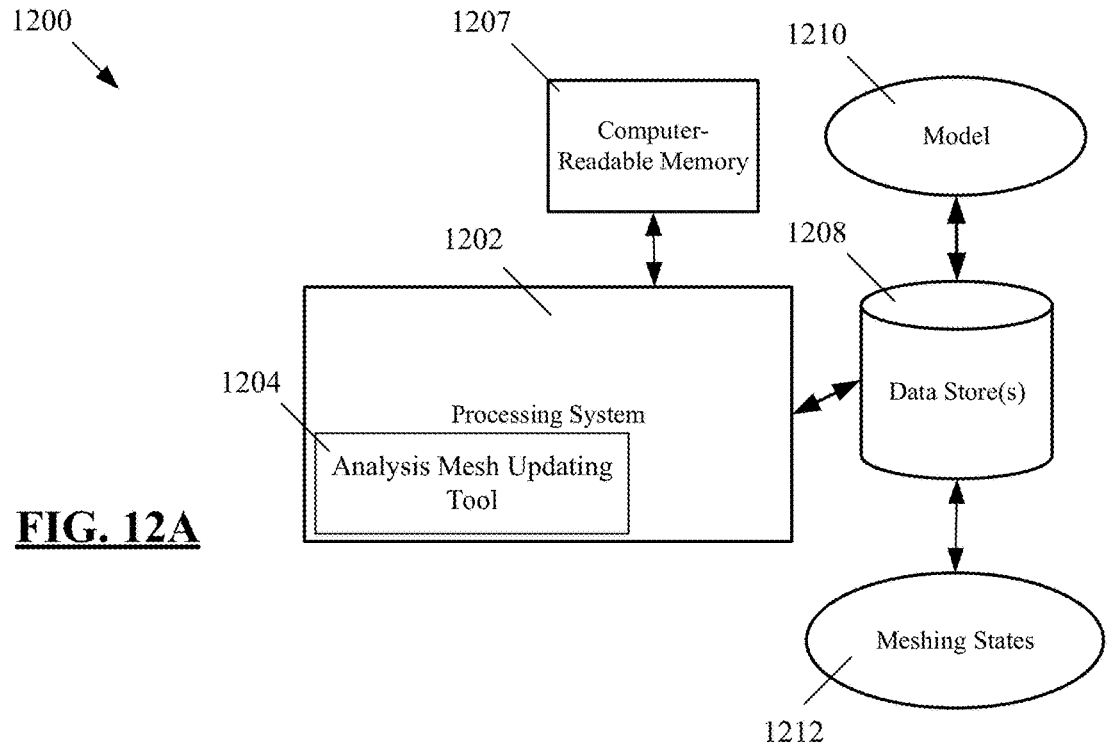
FIGS. 12A, 12B, and 12C depict example systems for implementing the techniques described herein.
Figure 12B:
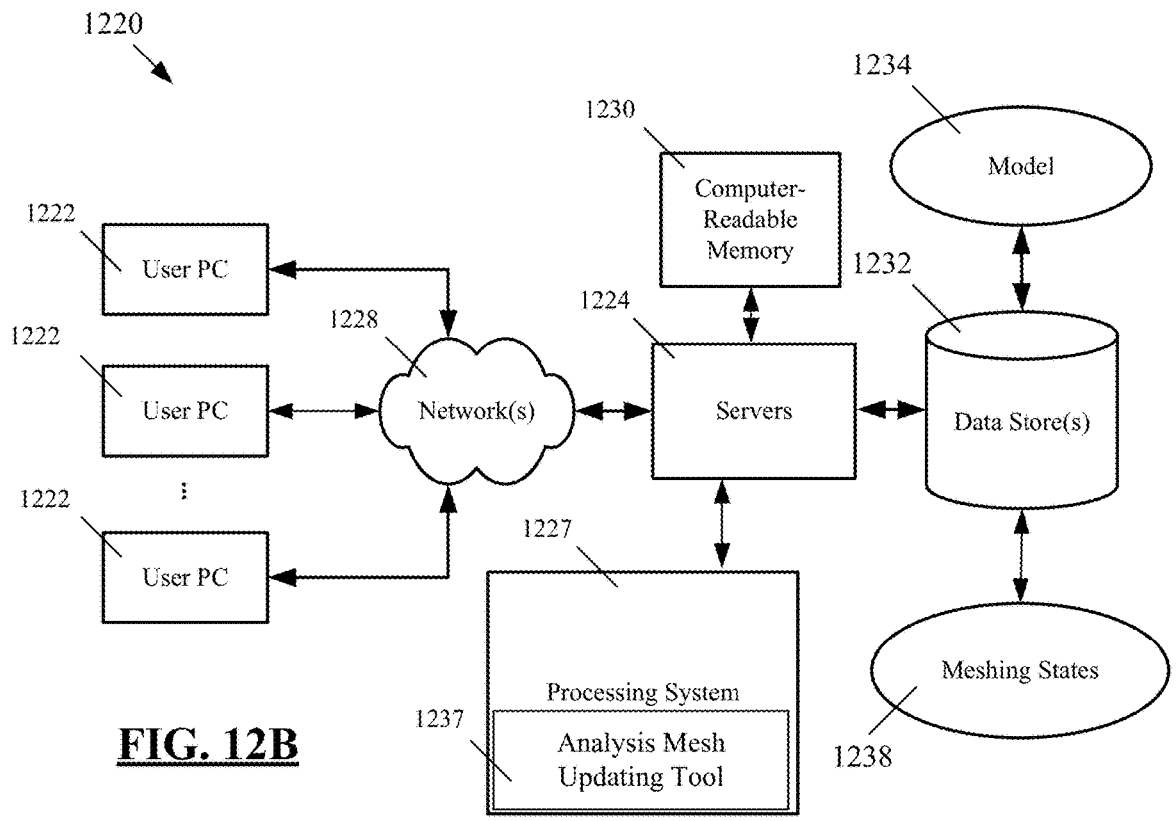
Figure 12C:
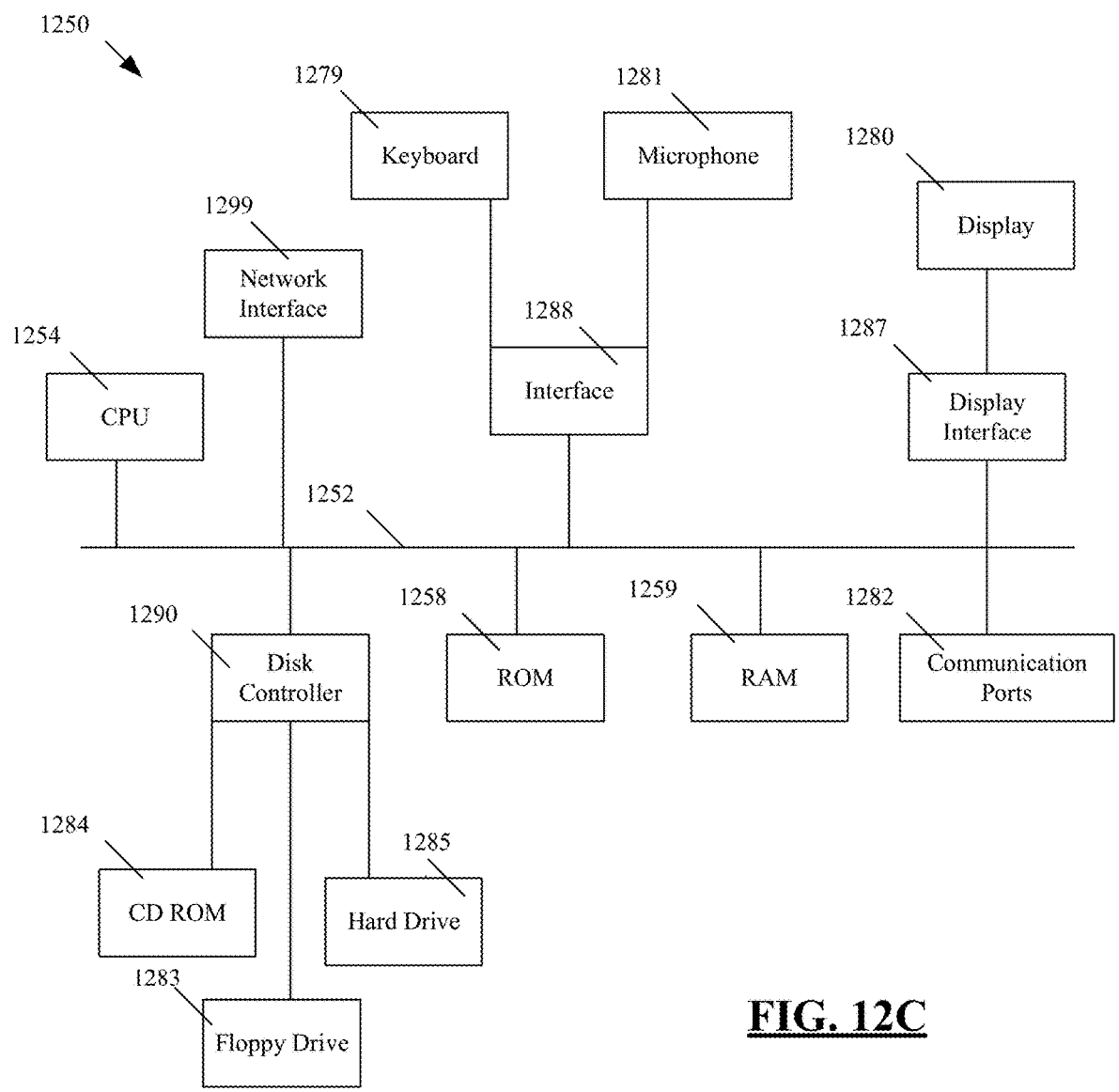

FIGS. 12A, 12B, and 12C depict example systems for implementing the techniques described herein. For example, FIG. 12A depicts an exemplary system 1200 that includes a standalone computer architecture where a processing system 1202 (e.g., one or more computer processors located in a given computer or in multiple computers that may be separate and distinct from one another) includes an analysis mesh updating tool 1204 being executed on the processing system 1202. The processing system 1202 has access to a computer-readable memory 1207 in addition to one or more data stores 1208. The one or more data stores 1208 may include an input model 1210 as well as data on meshing states 1212 for respective topologies of the input model. The processing system 1202 may be a distributed parallel computing environment, which may be used to handle very large-scale data sets.

FIG. 12B depicts a system 1220 that includes a client-server architecture. One or more user PCs 1222 access one or more servers 1224 running an analysis mesh updating tool 1237 on a processing system 1227 via one or more networks 1228. The one or more servers 1224 may access a computer-readable memory 1230 as well as one or more data stores 1232. The one or more data stores 1232 may include an input model 1234 as well as data on meshing states 1238 for respective topologies of the input model.

FIG. 12C shows a block diagram of exemplary hardware for a standalone computer architecture 1250, such as the architecture depicted in FIG. 12A that may be used to include and/or implement the program instructions of system embodiments of the present disclosure. A bus 1252 may serve as the information highway interconnecting the other illustrated components of the hardware. A processing system 1254 labeled CPU (central processing unit) (e.g., one or more computer processors at a given computer or at multiple computers), may perform calculations and logic operations required to execute a program. A non-transitory processor-readable storage medium, such as read only memory (ROM) 1258 and random access memory (RAM) 1259, may be in communication with the processing system 1254 and may include one or more programming instructions for performing methods (e.g., algorithms) for updating an analysis mesh in an efficient manner. Optionally, program instructions may be stored on a non-transitory computer-readable storage medium such as a magnetic disk, optical disk, recordable memory device, flash memory, or other physical storage medium.

In FIGS. 12A, 12B, and 12C, computer readable memories 1207, 1230, 1258, 1259 or data stores 1208, 1232, 1283, 1284 may include one or more data structures for storing and associating various data used in the example systems for modeling an LDO regulator or charge pump. For example, a data structure stored in any of the aforementioned locations may be used to store data for an input model and/or data on meshing states associated with the input model. A disk controller 1290 interfaces one or more optional disk drives to the system bus 1252. These disk drives may be external or internal floppy disk drives such as 1283, external or internal CD-ROM, CD-R, CD-RW or DVD drives such as 1284, or external or internal hard drives 1285. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1290, the ROM 1258 and/or the RAM 1259. The processor 1254 may access one or more components as required.

A display interface 1287 may permit information from the bus 1252 to be displayed on a display 1280 in audio, graphic, or alphanumeric format. Communication with external devices may optionally occur using various communication ports 1282.

In addition to these computer-type components, the hardware may also include data input devices, such as a keyboard 1279, or other input device 1281, such as a microphone, remote control, pointer, mouse and/or joystick. Such data input devices communicate with the standalone computer architecture 1250 via an interface 1288, in some embodiments. The standalone computer architecture 1250 further includes a network interface 1299 that enables the architecture 1250 to connect to a network, such as a network of the one or more networks 1228.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, C #, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method for updating a polygonal mesh representation of a model, the method comprising:
   displaying a model via a graphical user interface (GUI) of a computer-aided design modeling system, the model comprising a three dimensional (3D) boundary representation model comprising a set of topologies;
   maintaining a meshing state for each topology of the set of topologies, the meshing state indicating, for a given topology, whether a polygonal mesh exists and is valid;
   determining a change made to the model via the GUI, the change comprising a modification to a geometry of the model or a modification to mesh settings of a polygonal mesh representation of the model;
   determining one or more topologies of the set of topologies that are affected by the change and updating the meshing state for the affected one or more topologies;
   determining, based on the one or more updated meshing states, a set of meshing operations needed to bring the polygonal mesh representation of the model up-to-date; and
   performing the set of meshing operations to update the polygonal mesh representation of the model.

2. The computer-implemented method of claim 1, further comprising:
   displaying the polygonal mesh representation of the model via the GUI; and
   after performing the set of meshing operations, updating the display of the polygonal mesh representation in real-time or near real-time such that the display is updated at substantially the same time as the change is made.

3. The computer-implemented method of claim 1, wherein the performing of the set of meshing operations comprises:
   remeshing a subregion of the polygonal mesh representation, as specified by the set of meshing operations, without remeshing an entirety of the polygonal mesh representation.

4. The computer-implemented method of claim 3, wherein the remeshed subregion corresponds to the one or more topologies of the model affected by the change.

5. The computer-implemented method of claim 4, further comprising:
   displaying the polygonal mesh representation of the model via the GUI; and
   after performing the set of meshing operations, updating the display of the polygonal mesh representation only in the remeshed subregion.

6. The computer-implemented method of claim 1, wherein the determining of the set of meshing operations comprises:
   determining whether the polygonal mesh representation of the model exists;
   based on a determination that the polygonal mesh representation does not exist, generating a new polygonal mesh representation of the model;
   based on a determination that the polygonal mesh representation exists, determining whether an entirety of the polygonal mesh representation should be remeshed;
   based on a determination that the entirety of the polygonal mesh representation should be remeshed, remeshing the entirety of the polygonal mesh representation; and
   based on a determination that the entirety of the polygonal mesh representation should not be remeshed, remeshing a subregion of the polygonal mesh representation without remeshing the entirety of the polygonal mesh representation.

7. The computer-implemented method of claim 6, wherein the remeshing of the subregion comprises:
   determining whether the model comprises a shell or a solid;
   based on a determination that the model comprises a solid, (i) extracting interior volume elements within a bounded subregion of the solid, and (ii) generating exterior faces of the extracted elements based on the one or more affected topologies;
   based on a determination that the model comprises a shell, (i) extracting sheet elements surrounding the one or more affected topologies and creating a subregion, and (ii) extending the created subregion into adjacent faces by one element;
   clearing the subregion of all mesh elements; and
   remeshing the subregion.

8. The computer-implemented method of claim 1, further comprising:
   using physical data associated with a physical object to generate the model, the model comprising a virtual 3D object for modeling the physical object; and
   performing a computer-based analysis of the updated polygonal mesh representation, wherein the physical object is built or modified based on the computer-based analysis.

9. The computer-implemented method of claim 1, wherein the set of topologies comprises vertices, edges, faces, and bodies in a computer-aided design model and connections between the vertices, edges, faces, and bodies.

10. The computer-implemented method of claim 1, wherein the 3D boundary representation model includes surfaces that are organized topologically in boundary loops.

11. The computer-implemented method of claim 1, wherein the 3D boundary representation model includes a set of topologies comprising vertices, edges, faces, and bodies in a computer-aided design model and connections between the vertices, edges, faces, and bodies.

12. A system for updating a polygonal mesh representation of a model, the system comprising:
   a processing system; and
   computer-readable memory in communication with the processing system encoded with instructions for commanding the processing system to execute steps comprising:
      displaying a model via a graphical user interface (GUI) of a computer-aided design modeling system, the model comprising a three dimensional (3D) boundary representation model comprising a set of topologies;
      maintaining a meshing state for each topology of the set of topologies, the meshing state indicating, for a given topology, whether a polygonal mesh exists and is valid;
      determining a change made to the model via the GUI, the change comprising a modification to a geometry of the model or a modification to mesh settings of a polygonal mesh representation of the model;
      determining one or more topologies of the set of topologies that are affected by the change and updating the meshing state for the affected one or more topologies;
      determining, based on the one or more updated meshing states, a set of meshing operations needed to bring the polygonal mesh representation of the model up-to-date;
      performing the set of meshing operations to update the polygonal mesh representation of the model.

13. The system of claim 12, wherein the steps further comprise:
   displaying the polygonal mesh representation of the model via the GUI; and
   after performing the set of meshing operations, updating the display of the polygonal mesh representation in real-time or near real-time such that the display is updated at substantially the same time as the change is made.

14. The system of claim 12, wherein the performing of the set of meshing operations comprises:
   remeshing a subregion of the polygonal mesh representation, as specified by the set of meshing operations, without remeshing an entirety of the polygonal mesh representation.

15. The system of claim 14, wherein the remeshed subregion corresponds to the one or more topologies of the model affected by the change.

16. The system of claim 15, wherein the steps further comprise:
   displaying the polygonal mesh representation of the model via the GUI; and
   after performing the set of meshing operations, updating the display of the polygonal mesh representation only in the remeshed subregion.

17. The system of claim 12, wherein the determining of the set of meshing operations comprises:
   determining whether the polygonal mesh representation of the model exists;
   based on a determination that the polygonal mesh representation does not exist, generating a new polygonal mesh representation of the model;
   based on a determination that the polygonal mesh representation exists, determining whether an entirety of the polygonal mesh representation should be remeshed;
   based on a determination that the entirety of the polygonal mesh representation should be remeshed, remeshing the entirety of the polygonal mesh representation; and
   based on a determination that the entirety of the polygonal mesh representation should not be remeshed, remeshing a subregion of the polygonal mesh representation without remeshing the entirety of the polygonal mesh representation.

18. The system of claim 17, wherein the remeshing of the subregion comprises:
   determining whether the model comprises a shell or a solid;
   based on a determination that the model comprises a solid, (i) extracting interior volume elements within a bounded subregion of the solid, and (ii) generating exterior faces of the extracted elements based on the one or more affected topologies;
   based on a determination that the model comprises a shell, (i) extracting sheet elements surrounding the one or more affected topologies and creating a subregion, and (ii) extending the created subregion into adjacent faces by one element;
   clearing the subregion of all mesh elements; and
   remeshing the subregion.

19. The system of claim 12, wherein the steps further comprise:

using physical data associated with a physical object to generate the model, the model comprising a virtual 3D object for modeling the physical object; and performing a computer-based analysis of the updated polygonal mesh representation, wherein the physical object is built or modified based on the computer-based analysis.

20. A non-transitory computer-readable storage medium for updating a polygonal mesh representation of a model, the computer-readable storage medium comprising computer executable instructions which, when executed, cause a processing system to execute steps comprising:

displaying a model via a graphical user interface (GUI) of a computer-aided design modeling system, the model comprising a three dimensional (3D) boundary representation model comprising a set of topologies;

maintaining a meshing state for each topology of the set of topologies, the meshing state indicating, for a given topology, whether a polygonal mesh exists and is valid;

determining a change made to the model via the GUI, the change comprising a modification to a geometry of the model or a modification to mesh settings of a polygonal mesh representation of the model;

determining one or more topologies of the set of topologies that are affected by the change and updating the meshing state for the affected one or more topologies;

determining, based on the one or more updated meshing states, a set of meshing operations needed to bring the polygonal mesh representation of the model up-to-date; and performing the set of meshing operations to update the polygonal mesh representation of the model.

* * * * *